United States Patent
Ye

(10) Patent No.: US 11,526,226 B2
(45) Date of Patent: Dec. 13, 2022

(54) TOUCH CONTROL DISPLAY SCREEN AND ELECTRONIC DEVICE

(71) Applicant: WUHAN CHINA STAR OPTOELECTRONICS SEMICONDUCTOR DISPLAY TECHNOLOGY CO., LTD., Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/978,703

(22) PCT Filed: Jul. 21, 2020

(86) PCT No.: PCT/CN2020/103267
§ 371 (c)(1),
(2) Date: Sep. 6, 2020

(87) PCT Pub. No.: WO2022/000614
PCT Pub. Date: Jan. 6, 2022

(65) Prior Publication Data
US 2021/0405803 A1 Dec. 30, 2021

(30) Foreign Application Priority Data
Jun. 30, 2020 (CN) .......................... 202010620265.7

(51) Int. Cl.
G06F 3/041 (2006.01)
G06F 3/044 (2006.01)
H01L 27/32 (2006.01)

(52) U.S. Cl.
CPC .......... *G06F 3/0416* (2013.01); *G06F 3/0412* (2013.01); *G06F 3/0446* (2019.05); *H01L 27/323* (2013.01)

(58) Field of Classification Search
None
See application file for complete search history.

(56) References Cited

U.S. PATENT DOCUMENTS

2017/0010734 A1* 1/2017 Liu .................... H01L 51/56
2018/0329553 A1* 11/2018 Chiang ............... G06F 3/04164

* cited by examiner

*Primary Examiner* — Brian M Butcher
(74) *Attorney, Agent, or Firm* — PV IP PC; Wei Te Chung; Ude Lu

(57) ABSTRACT

A touch control display screen and an electronic device are provided. The touch control display screen includes: a display panel, including a plurality of protruding photo spacers and a cathode layer, wherein the cathode layer covers at least part of the photo spacers; and a touch control panel disposed on a side of the display panel, wherein the touch control panel includes a plurality of touch control electrodes, and a plurality of orthographic projections of the touch control electrodes on the touch control panel and a plurality of orthographic projections of the photo spacers on the touch control panel are spaced apart from each other.

18 Claims, 4 Drawing Sheets

TOUCH CONTROL DISPLAY SCREEN AND ELECTRONIC DEVICE

FIELD

The present disclosure relates to the field of display, and more particularly, relates to a touch control display screen and an electronic device including the touch control display screen.

BACKGROUND

Flexible organic light-emitting diode (OLED) display devices have become increasingly popular in market due to merits such as self-luminescence, wide viewing angles, wide color gamut, high brightness, fast response times, low power consumption, and bendable structures. Therefore, the flexible OLED display devices have gradually replaced liquid crystal displays (LCDs) to become a mainstream display technology.

Flexible OLEDs can be divided into two types, namely top-emitting OLEDs and bottom-emitting OLEDs, according to a position where light is emitted. Nowadays, the top-emitting OLEDs are more popular in mass production technologies. As shown in FIG. 1, a conventional touch control display screen, from bottom to top, sequentially includes a thin-film transistor (TFT) array substrate 100, an organic luminescent layer 200, a thin-film encapsulation (TFE) layer 300, and a touch control electrode layer 400 disposed on the TFE layer 300. The luminescent layer 200 further includes an anode layer 201, a pixel defining layer 202, an electroluminescent layer 203, and a cathode layer 204. Multiple photo spacers 205 are regularly distributed on the pixel defining layer and form multiple small protrusions. During vapor-deposition processes to form a luminescent layer, only the protruded photo spacers on a surface of an array substrate are in contact with a fine metal mask, thereby effectively preventing metal wires on the array substrate from being scratched.

Because the entire cathode layer of OLEDs is vapor-deposited on an upper surface of the pixel defining layer of the array substrate, a distance D1 from the cathode layer at a position where the photo spacers are disposed to multiple touch control electrodes on a surface of the TFE layer is less than a distance D2 from the cathode layer at an upper surface of the pixel defining layer around the photo spacers to the touch control electrodes on the surface of the TFE layer, contributing to relatively large parasitic capacitances of the touch control electrodes above the photo spacers, which affects touch sensitivity of areas corresponding to the photo spacers. Furthermore, if distances from the electrodes at different areas of the touch control electrode layer to the cathode layer of the OLEDs are different, parasitic capacitances between the touch control electrodes at different areas and the cathode layer will be different, resulting in different touch control electrode signals coupling to OLED display panels, which makes noise that affects a touch experience.

Therefore, it is necessary to provide a technical solution to solve a problem of different parasitic capacitances occurring between cathodes at different positions and touch control electrodes, thereby preventing reduction of touch control sensibility and preventing noise.

SUMMARY

The present disclosure provides a touch control display screen and an electronic device to prevent a following problem: different parasitic capacitances occur between cathodes at different positions and touch control electrodes, resulting in reduction of touch control sensibility and making noise.

In a first aspect, an embodiment of the present disclosure provides a touch control display screen, including: a display panel, wherein the display panel includes a plurality of protruding photo spacers and a cathode layer, and the cathode layer covers at least part of the photo spacers; and a touch control panel, wherein the touch control panel is disposed on a side of the display panel and includes a plurality of touch control electrodes, and a plurality of orthographic projections of the touch control electrodes on the touch control panel and a plurality of orthographic projections of the photo spacers on the touch control panel are spaced apart from each other.

In the touch control display screen, the touch control panel includes a plurality of floating electrodes which are electrically insulated from the touch control panel, and a plurality of orthographic projections of the floating electrodes overlap with the orthographic projections of the photo spacers on the touch control panel.

In the touch control display screen, the touch control electrodes and the floating electrodes are disposed on a same layer and are formed by patterning a same metal layer, and the floating electrodes are isolated from the touch control electrodes adjacent thereto.

In the touch control display screen, each of the floating electrodes has a second metal pattern including at least one metal line or has a first metal pattern including a plurality of metal grids.

In the touch control display screen, the touch control electrodes include a plurality of driving electrodes and a plurality of sensing electrodes, which are electrically insulated from each other, the floating electrodes are disposed at a plurality of intervals between the driving electrodes and the sensing electrodes, and/or the floating electrodes are disposed in the driving electrodes and/or the sensing electrodes.

In the touch control display screen, the floating electrodes disposed at the intervals between the driving electrodes and the sensing electrodes have the second metal patterns, and the floating electrodes disposed in the driving electrodes and/or the sensing electrodes have the first metal patterns.

In the touch control display screen, the floating electrodes disposed in the driving electrodes or the sensing electrodes have the first metal patterns arranged in an array manner, and the first metal patterns have a same size.

In the touch control display screen, a plurality of luminescent sub-pixels are disposed on the display panel, the photo spacers are arranged at a plurality of intervals between adjacent luminescent sub-pixels, and the touch control electrodes are a plurality of metal grids formed from a plurality of wires extending along the intervals between adjacent luminescent sub-pixels.

In the touch control display screen, the metal grids include a straight-line structure or a curved-line structure.

In a second aspect, an embodiment of the present disclosure further provides an electronic device. The electronic device includes a touch control display screen, and the touch control display screen includes: a display panel, wherein the display panel includes a plurality of protruding photo spacers and a cathode layer, and the cathode layer covers at least part of the photo spacers; and a touch control panel, wherein the touch control panel is disposed on a side of the display panel and includes a plurality of touch control electrodes, and a plurality of orthographic projections of the touch control electrodes on the touch control panel and a plurality of orthographic projections of the photo spacers on the touch control panel are spaced apart from each other.

In the electronic device, the touch control panel includes a plurality of floating electrodes which are electrically insulated from the touch control panel, and a plurality of orthographic projections of the floating electrodes overlap with the orthographic projections of the photo spacers on the touch control panel.

In the electronic device, the touch control electrodes and the floating electrodes are disposed on a same layer and are formed by patterning a same metal layer, and the floating electrodes are isolated from the touch control electrodes adjacent thereto.

In the electronic device, each of the floating electrodes has a second metal pattern including at least one metal line or has a first metal pattern including a plurality of metal grids.

In the electronic device, the touch control electrodes include a plurality of driving electrodes and a plurality of sensing electrodes, which are electrically insulated from each other, the floating electrodes are disposed at a plurality of intervals between the driving electrodes and the sensing electrodes, and/or the floating electrodes are disposed in the driving electrodes and/or the sensing electrodes.

In the electronic device, the floating electrodes disposed at the intervals between the driving electrodes and the sensing electrodes have the second metal patterns, and the floating electrodes disposed in the driving electrodes and/or the sensing electrodes have the first metal patterns.

In the electronic device, the floating electrodes disposed in the driving electrodes or the sensing electrodes have the first metal patterns arranged in an array manner, and the first metal patterns have a same size.

In the electronic device, a plurality of luminescent sub-pixels are disposed on the display panel, the photo spacers are arranged at a plurality of intervals between adjacent luminescent sub-pixels, and the touch control electrodes are a plurality of metal grids formed from a plurality of wires extending along the intervals between adjacent luminescent sub-pixels.

In the electronic device, the metal grids include a straight-line structure or a curved-line structure.

Regarding the beneficial effects: compared with conventional technologies, a touch control display screen and an electronic device provided by the present disclosure may effectively prevent following problems: 1. In conventional touch control display screens, distances from touch control electrodes above the photo spacers to a cathode layer of OLEDs and distances from touch control electrodes not above the photo spacers to the cathode layer of the OLEDs are different, resulting in differences in parasitic capacitances, and contributing to noise caused by different touch control electrode signals coupling to OLED display panels. 2. Distances from the cathode layer of the OLEDs above the photo spacers to touch control electrodes disposed on a surface of a thin-film encapsulation layer are relatively short, resulting in relatively large parasitic capacitances of the touch control electrodes above the photo spacers, which deteriorates sensibility of positions corresponding to the photo spacers, and affects a reporting rate of the entire touch control display screens.

DETAILED DESCRIPTION

The present disclosure provides a touch control display screen and an electronic device. Embodiments are further described below in detail with reference to accompanying drawings to make objectives, technical solutions, and effects of the present disclosure clearer and more precise. It should be noted that described embodiments are merely used to construct the present disclosure and are not intended to limit the present disclosure.

Figure 1:
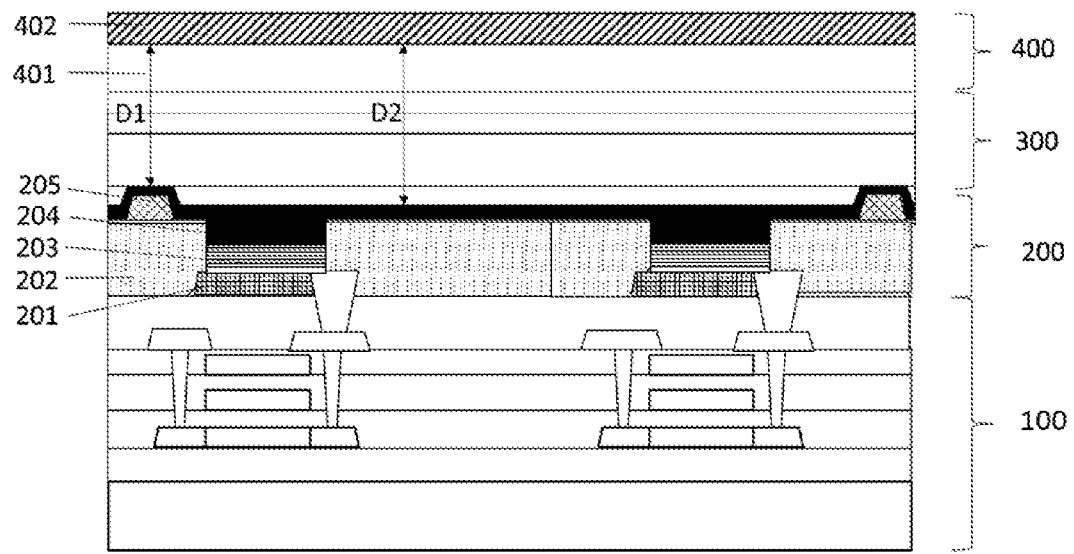
FIG. 1 is a structural perspective view showing a conventional touch control display screen.
Figure 2:
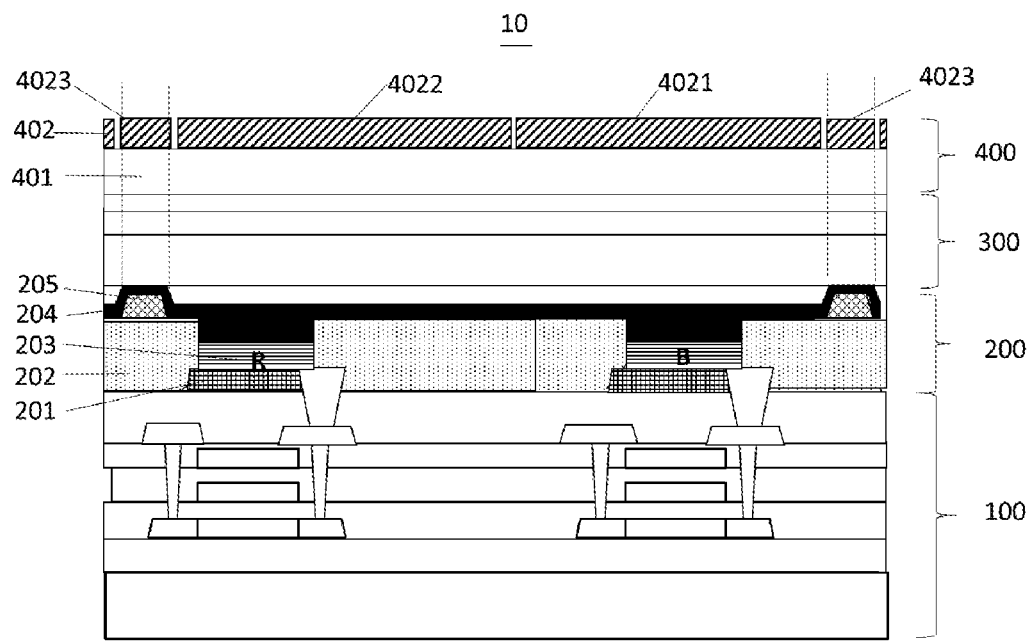
FIG. 2 is a structural perspective view showing a touch control display screen provided by an embodiment of the present disclosure.

Please refer to FIG. 2, an embodiment of the present disclosure provides a touch control display screen 10, including a display panel and a touch control panel. The display panel, from bottom to top, sequentially includes a thin-film transistor (TFT) array substrate 100, an organic luminescent layer 200, and a thin-film encapsulation (TFE) layer 300, wherein the organic luminescent layer 200 further includes an anode layer 201, a pixel defining layer 202, an electroluminescent layer 203, a cathode layer 204, and a plurality of photo spacers 205. A touch control panel 400 is disposed on a side of the TFE layer 300 of the display panel and is stacked on the display panel. The touch control panel 400 includes an insulating layer 401 and a touch control electrode layer 402, and the insulating layer 401 is disposed between the TFE layer 300 and the touch control electrode layer 402.

The photo spacers 205 are regularly distributed on an upper surface of the pixel defining layer 202 and from a plurality of small protrusions, and the cathode layer 204 covers at least part of upper surfaces of the photo spacers 205.

The touch control electrode layer 402 includes a plurality of touch control electrodes. The touch control electrodes include a plurality of driving electrodes 4021 and a plurality of sensing electrodes 4022. The driving electrodes 4021 and the sensing electrodes 4022 are electrically insulated from each other. Orthographic projections of the touch control electrodes on the touch control panel 400 are spaced apart from orthographic projections of the photo spacers 205 on the touch control panel 400. As shown in FIG. 2, the driving electrodes 4021 and the sensing electrodes 4022 of the touch control electrode layer are disposed on areas bypassing the orthographic projections of the photo spacers 205 on the display panel 400. Since the touch control electrode layer 402 is a top portion of the touch control panel 400, the orthographic projections of the photo spacers 205 are on the touch control electrode layer of the touch control panel. By the above arrangement, relatively large parasitic capacitances will not form between the cathode layer at positions of the photo spacers and the touch control electrodes because there is no touch control electrode disposed above the photo spacers. Therefore, deterioration of touch sensibility of areas corresponding to the photo spacers is prevented, and a report rate of the entire touch control display screen will not be affected.

In some embodiments, please continue referring to FIG. 2, the touch control panel 400 of the present disclosure further includes a plurality of floating electrodes 4023. The floating electrodes 4023, the driving electrodes 4021, and the sensing electrodes 4022 are electrically insulated from each other. Orthographic projections of the floating electrodes 4023 on the touch control panel 400 overlap with orthographic projections of the photo spacers 205 on the touch control panel 400. Because the floating electrodes are not effective touch control electrodes and are not connected to any external metal wire or any effective touch control electrode, parasitic capacitances of the touch control electrodes will not increase, and noise affecting a touch experience will be made.

In some embodiments, please continue referring to FIG. 2, the driving electrodes 4021, the sensing electrodes 4022, and the floating electrodes 4023 are disposed on a same layer, and are formed by patterning a same metal layer. The floating electrodes are isolated from the touch control electrodes adjacent thereto.

In the present embodiment, a plurality of luminescent sub-pixels are disposed on the pixel defining layer 202 of the touch control display screen in an array manner. Please refer to FIGS. 2 to 3, the photo spacers 205 are correspondingly disposed at a plurality of intervals between adjacent luminescent sub-pixels 101 of the pixel defining layer 202, thereby bypassing the luminescent sub-pixels 101.

The touch control electrodes have a metal grid structure. Please refer to FIGS. 3 to 4, the intervals are formed between adjacent luminescent sub-pixels 101, the metal grid structure is formed from a plurality of metal wires extending along the intervals, and the luminescent sub-pixels 101 are positioned at a plurality of mesh openings of the grid structure. Shapes of the mesh openings of the grid structure are correspondingly determined according to shapes of the luminescent sub-pixels. Please continue referring to FIG. 3, in some embodiments, when the luminescent sub-pixels are regular shapes, such as a rectangle, a square, or a circle, edges of the mesh openings of the metal grid structure may be straight lines, thereby forming a plurality of regular rectangles or rhombuses, and thereby simplifying arrangements of the metal grip structure. In other embodiments, please continue referring to FIG. 4, when the luminescent sub-pixels are curved shapes, such as an ellipse, the mesh openings of the metal grid structure may also correspondingly be curved shapes. As a result, distances from the metal lines of the mesh openings to sub-pixels adjacent thereto are roughly equal, thereby ensuring that light can be evenly emitted from the display panel.

In some embodiments, the floating electrodes may have a plurality of different metal patterns which are isolated from the touch control electrodes adjacent thereto.

Figure 3:
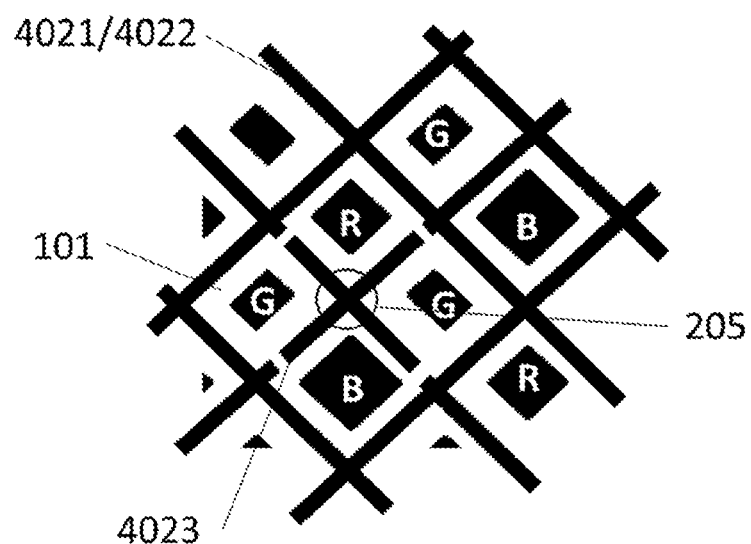
FIG. 3 is a schematic plan view showing a touch control electrode layer of the touch control display screen provided by the embodiment of the present disclosure.
Figure 4:
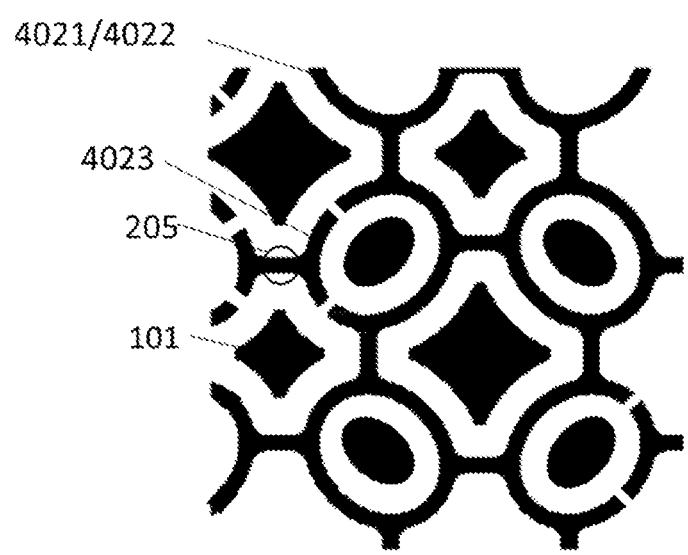
FIG. 4 is another schematic plan view showing the touch control electrode layer of the touch control display screen provided by the embodiment of the present disclosure.

The patterns of the floating electrodes are described in detail with reference to FIGS. 3 to 5 and specific embodiments. Please continue referring to FIG. 3, each of the floating electrodes 4023 has a second metal pattern including at least one metal line which is part of the metal grid structure. Specifically, the at least one metal line is a metal pattern that cannot form a complete metal grid. In the present embodiment, the second metal pattern is preferably two metal lines criss-crossing each other. The two metal lines are isolated from the touch control electrode patterns adjacent thereto, so that the floating electrodes are electrically isolated. The orthographic projections of the photo spacers 205 on the touch control panel overlap with positions of the metal lines of the metal patterns, and the overlapping positions may be an intersection between the two metal lines or other positions of the two metal lines. In the present embodiment, preferably, the second metal patterns overlap with the orthographic projections of the photo spacers on the touch control electrode layer at the intersection of the two metal lines. In other embodiments, please continue referring to FIG. 4, when the metal grid structure is a curved shape, the second metal patterns of the floating electrodes 4023 are a plurality metal lines with irregular shapes. The second metal patterns are also isolated from the control electrode patterns adjacent thereto, and the orthographic projections of the photo spacers 205 on the touch control electrode layer of the touch control panel overlap with positions of the metal lines of the second metal patterns.

Figure 5:
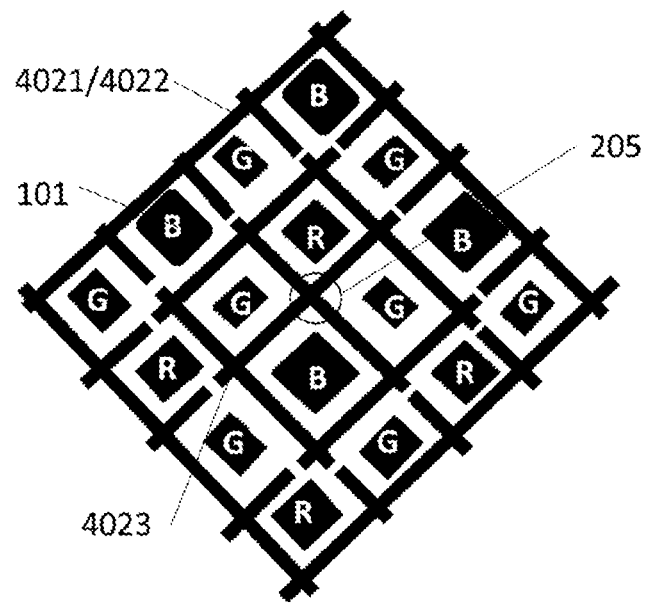
FIG. 5 is yet another schematic plan view showing the touch control electrode layer of the touch control display screen provided by the embodiment of the present disclosure.

Please continue referring to FIG. 5, each of the floating electrodes 4023 may have a first metal pattern including a plurality of complete metal grids. The first metal pattern may be a rhombus, a rectangle, a triangle, a circle, or other shapes. Edges of each of the metal grids of the first metal pattern may be a straight line as shown in FIG. 5, or may be a curved line which is mentioned above. The metal grids of each of the floating electrodes are connected to each other, and are isolated from the touch control electrodes adjacent thereto, thereby ensuring that the floating electrodes are electrically insulated.

The floating electrodes may be disposed between the driving electrodes and the sensing electrodes, thereby isolating the driving electrodes from the sensing electrodes. Also, the floating electrodes may be disposed in the driving electrodes and/or the sensing electrodes, or may be simultaneously disposed between the driving electrodes and the sensing electrodes and in the driving electrodes and the sensing electrodes. In some embodiments, the floating electrodes disposed between the driving electrodes and the sensing electrodes have the second metal patterns, and the floating electrodes disposed in the driving electrodes or the sensing electrodes have the first metal patterns. Because the metal lines of the second metal patterns do not form a complete metal grid pattern, they occupy a relatively small area. The first second metal patterns disposed between the driving electrodes and the sensing electrodes can well isolate the driving electrodes from the sensing electrodes. The first metal patterns include a plurality of complete metal grids. Compared with the second metal patterns, the first metal patterns generally occupy a relatively large area. The first metal patterns disposed in the touch control electrodes can well reduce parasitic capacitances. Therefore, touch control precision can be improved. Furthermore, sizes of the first metal patterns can be adapted by adjusting an amount of the metal grids. For example, each of the floating electrodes in the touch control electrodes may have an entire first metal pattern with a relatively large size, or may have a plurality of isolated first metal patterns with a same and relatively small size.

Figure 6:
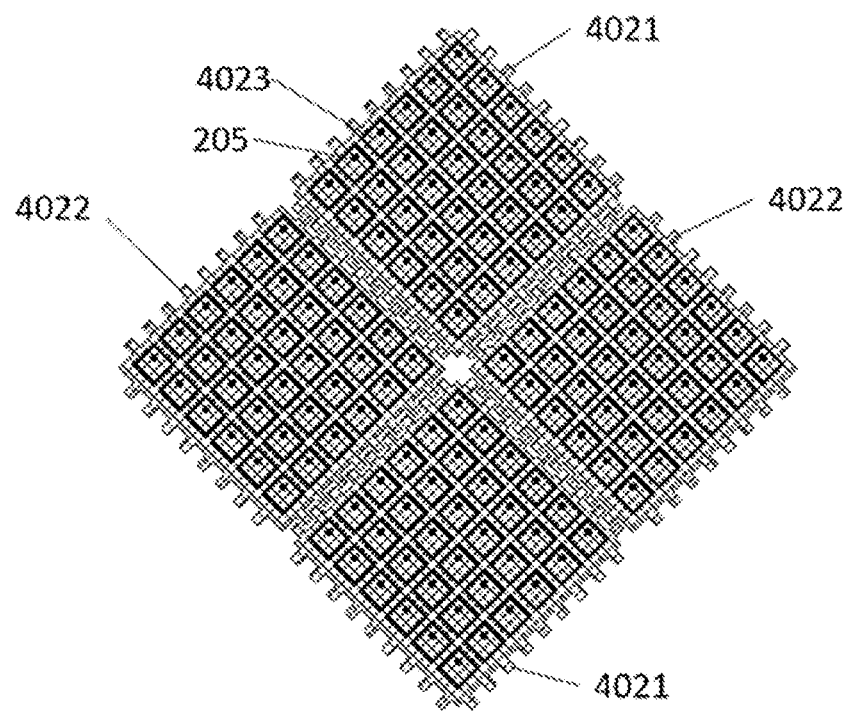
FIG. 6 is a schematic plan view showing a touch control electrode unit of the touch control display screen provided by the embodiment of the present disclosure.

Please refer to FIG. 6, the touch control electrodes are formed from a plurality of touch control units which are arranged in an array manner. The driving electrodes 4021 and the sensing electrodes 4022 are alternately arranged to form a rhombic touch control electrode unit. In the rhombic touch control electrode, the floating electrodes 4023 are disposed in the driving electrodes 4021 and the sensing electrodes 4022. The floating electrodes 4023 include a plurality of first metal patterns arranged in an array manner, and the second metal patterns have a same size. The first metal patterns are rhombic, are isolated from the touch control electrode patterns adjacent thereto, and are not electrically connected to any external metal line or electrode. The orthographic projections of the photo spacers 205 on the touch control panel overlap with positions where the metal lines of the rhombic first metal patterns are formed.

Therefore, the touch control electrodes can be evenly arranged, resulting in an even electric field. Differences in parasitic capacitances in different positions are reduced as much as possible, thereby preventing noise from affecting a touch experience. Furthermore, there is no blank area, which the metal lines are not disposed on, on the touch control electrode layer, so that display effect of the display panel can be ensured.

Figure 7:
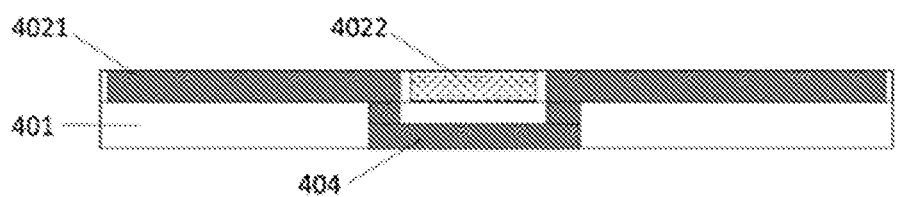
FIG. 7 is a structural perspective view showing the touch control electrode layer of the touch control display screen provided by the embodiment of the present disclosure.

In each of the touch control units, the touch control electrodes may be connected to each other by a plurality of metal bridges. As shown in FIG. 7, the driving electrode 4021 is separated in the touch control electrode layer 402 and the sensing electrode 4022 is complete. The separated driving electrodes 4021 are connected to each other by a connecting bridge 404 which is disposed in the insulating layer 401 under the touch control electrode layer 402, and the connecting bridge 404 may have a double-bridge structure. In other embodiments, in the touch control electrode layer, the sensing electrodes are separated by the driving electrodes, and the separated sensing electrodes are connected to each other by the connecting bridges in the insulating layer.

An embodiment of the present disclosure further provides an electronic device, including the above touch control display screen. The electronic device may be a portable mobile terminal, including, but not limited to a cell phone, a tablet, a pad, or a wearable device.

It should be noted that many changes and modifications to the described embodiments can be carried out by those skilled in the art, and all such changes and modifications are intended to be included within the scope of the appended claims.

What is claimed is:

1. A touch control display screen, comprising:
   a display panel, wherein the display panel comprises a plurality of protruding photo spacers and a cathode layer, and the cathode layer covers at least part of the photo spacers; and
   a touch control panel, wherein the touch control panel is disposed on a side of the display panel and comprises a plurality of touch control electrodes, and a plurality of orthographic projections of the touch control electrodes on the touch control panel and a plurality of orthographic projections of the photo spacers on the touch control panel are spaced apart from each other; and
   wherein the touch control panel comprises a plurality of floating electrodes which are electrically insulated from the touch control panel, the touch control electrodes comprise a plurality of driving electrodes and a plurality of sensing electrodes which are electrically insulated from each other, the floating electrodes are disposed at a plurality of intervals between the driving electrodes and the sensing electrodes, or the floating electrodes are disposed in the driving electrodes or the sensing electrodes.

2. The touch control display screen of claim 1, wherein the floating electrodes disposed at the intervals between the driving electrodes and the sensing electrodes have a second metal pattern, or the floating electrodes disposed in the driving electrodes or the sensing electrodes have a first metal pattern.

3. The touch control display screen of claim 2, wherein the floating electrodes disposed in the driving electrodes or the sensing electrodes have the first metal pattern arranged in an array manner, and the first metal patterns have a same size.

4. The touch control display screen of claim 1, wherein a plurality of luminescent sub-pixels are disposed on the display panel, the photo spacers are arranged at a plurality of intervals between adjacent luminescent sub-pixels, and the touch control electrodes are a plurality of metal grids formed from a plurality of wires extending along the intervals between adjacent luminescent sub-pixels.

5. An electronic device, comprising a touch control display screen, wherein the touch control display screen comprises:
   a display panel, wherein the display panel comprises a plurality of protruding photo spacers and a cathode layer, and the cathode layer covers at least part of the photo spacers; and
   a touch control panel, wherein the touch control panel is disposed on a side of the display panel and comprises a plurality of touch control electrodes, and a plurality of orthographic projections of the touch control electrodes on the touch control panel and a plurality of orthographic projections of the photo spacers on the touch control panel are spaced apart from each other; and
   wherein the touch control panel comprises a plurality of floating electrodes which are electrically insulated from the touch control panel, the touch control electrodes comprise a plurality of driving electrodes and a plurality of sensing electrodes which are electrically insulated from each other, the floating electrodes are disposed at a plurality of intervals between the driving electrodes and the sensing electrodes, or the floating electrodes are disposed in the driving electrodes or the sensing electrodes.

6. The electronic device of claim 5, wherein the floating electrodes disposed at the intervals between the driving electrodes and the sensing electrodes have a second metal pattern, or the floating electrodes disposed in the driving electrodes or the sensing electrodes have a first metal pattern.

7. The electronic device of claim 6, wherein the floating electrodes disposed in the driving electrodes or the sensing electrodes have the first metal pattern arranged in an array manner, and the first metal patterns have a same size.

8. The electronic device of claim 5, wherein a plurality of luminescent sub-pixels are disposed on the display panel, the photo spacers are arranged at a plurality of intervals between adjacent luminescent sub-pixels, and the touch control electrodes are a plurality of metal grids formed from a plurality of wires extending along the intervals between adjacent luminescent sub-pixels.

9. The touch control display screen of claim 1, wherein a plurality of orthographic projections of the floating electrodes overlap with the orthographic projections of the photo spacers on the touch control panel.

10. The touch control display screen of claim 9, wherein the touch control electrodes and the floating electrodes are disposed on a same layer and are formed by patterning a same metal layer, and the floating electrodes are isolated from the touch control electrodes adjacent thereto.

11. The touch control display screen of claim 10, wherein each of the floating electrodes has a first metal pattern comprising a plurality of metal grids or a second metal pattern comprising at least one metal line.

12. The touch control display screen of claim 11, wherein the metal grids comprise a straight-line structure or a curved-line structure.

13. The touch control display screen of claim 4, wherein the metal grids comprise a straight-line structure or a curved-line structure.

14. The electronic device of claim 5, wherein a plurality of orthographic projections of the floating electrodes overlap with the orthographic projections of the photo spacers on the touch control panel.

15. The electronic device of claim 14, wherein the touch control electrodes and the floating electrodes are disposed on a same layer and are formed by patterning a same metal layer, and the floating electrodes are isolated from the touch control electrodes adjacent thereto.

16. The electronic device of claim 15, wherein each of the floating electrodes has a first metal pattern comprising a plurality of metal grids or a second metal pattern comprising at least one metal line.

17. The electronic device of claim 16, wherein the metal grids comprise a straight-line structure or a curved-line structure.

18. The electronic device of claim 8, wherein the metal grids comprise a straight-line structure or a curved-line structure.

* * * * *